(12) United States Patent
Statham

(10) Patent No.: US 6,928,170 B1
(45) Date of Patent: Aug. 9, 2005

(54) WIRELESS MICROPHONE HAVING A SPLIT-BAND AUDIO FREQUENCY COMPANDING SYSTEM THAT PROVIDES IMPROVED NOISE REDUCTION AND SOUND QUALITY

(75) Inventor: Kelly Statham, Cleveland Heights, OH (US)

(73) Assignee: Audio Technica, Inc., Stow, OH (US)

( * ) Notice: Subject to any disclaimer, the term of this patent is extended or adjusted under 35 U.S.C. 154(b) by 517 days.

(21) Appl. No.: 09/704,937

(22) Filed: Nov. 2, 2000

(51) Int. Cl.[7] .................................................. H04R 3/00
(52) U.S. Cl. ......................... 381/92; 385/95; 385/106; 455/72
(58) Field of Search .......................... 381/28, 77, 92, 381/95, 106, 104, 122; 455/42, 43, 72, 91, 126

(56) References Cited

U.S. PATENT DOCUMENTS

| | | |
|---|---|---|
| 3,969,680 A | 7/1976 | Wermuth |
| 4,215,431 A * | 7/1980 | Nady ........................... 455/43 |
| 4,281,295 A | 7/1981 | Nishimura et al. |
| 4,353,035 A | 10/1982 | Schröder |
| 4,368,435 A | 1/1983 | Bloy |
| 4,381,488 A | 4/1983 | Fricke et al. |
| 4,412,100 A | 10/1983 | Orban |
| 4,449,106 A | 5/1984 | Ishigaki et al. |
| 4,701,953 A | 10/1987 | White |
| 4,736,433 A | 4/1988 | Dolby |
| 4,922,535 A | 5/1990 | Dolby |
| 5,278,912 A | 1/1994 | Waldhauer |
| 5,488,668 A | 1/1996 | Waldhauer |
| 5,574,791 A | 11/1996 | Orban |
| 5,832,097 A | 11/1998 | Armstrong et al. |
| 5,907,623 A | 5/1999 | Mercs et al. |

* cited by examiner

Primary Examiner—Minsun Oh Harvey
(74) Attorney, Agent, or Firm—Welsh & Katz, Ltd.

(57) ABSTRACT

A wireless microphone having a split-band audio frequency companding system is disclosed. The companding system includes a compression circuit in which one amplification element is utilized in connection with a number of frequency bands. Each frequency band has a rectifier and filter element associated therewith. High-pass filter elements are utilized in the higher frequency bands of the compression and expander circuits to reduce the transfer of low-frequency signals to the rectifier elements that process the low-frequency signals, thereby reducing undesirable modulations of a variable resistance element associated therewith.

3 Claims, 7 Drawing Sheets

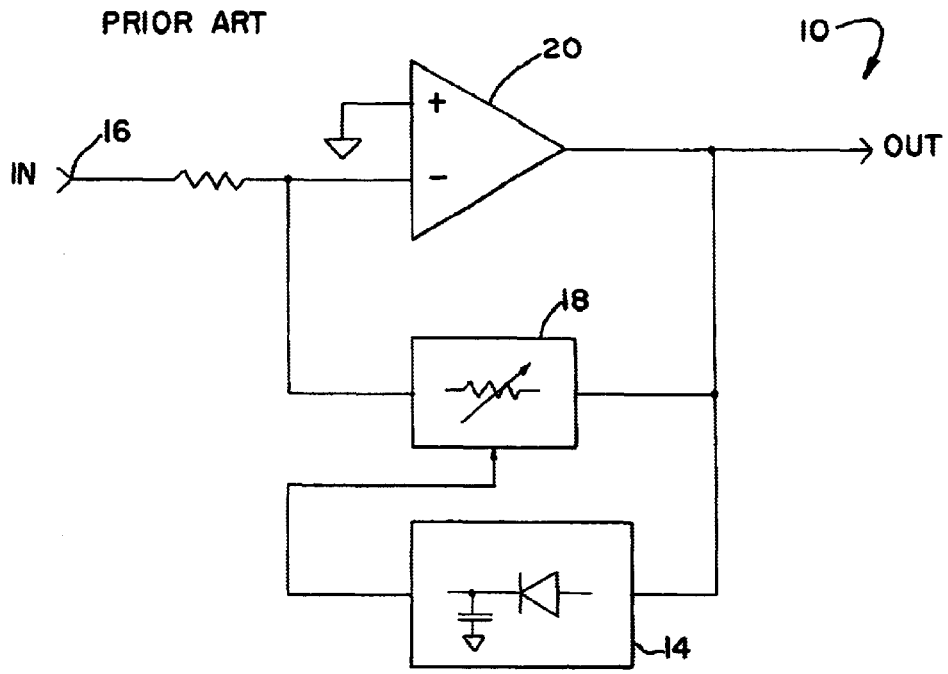
FIG. IA
PRIOR ART
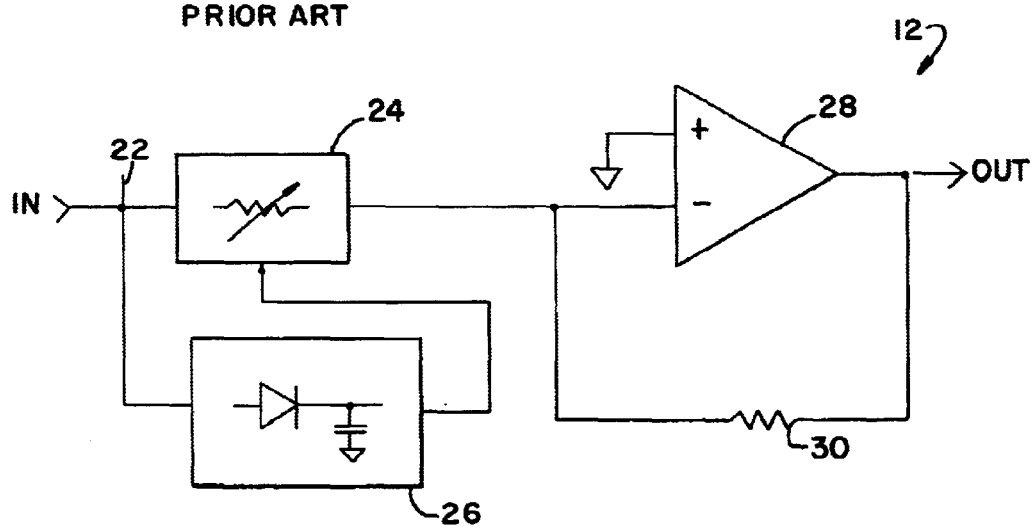
FIG. IB
PRIOR ART

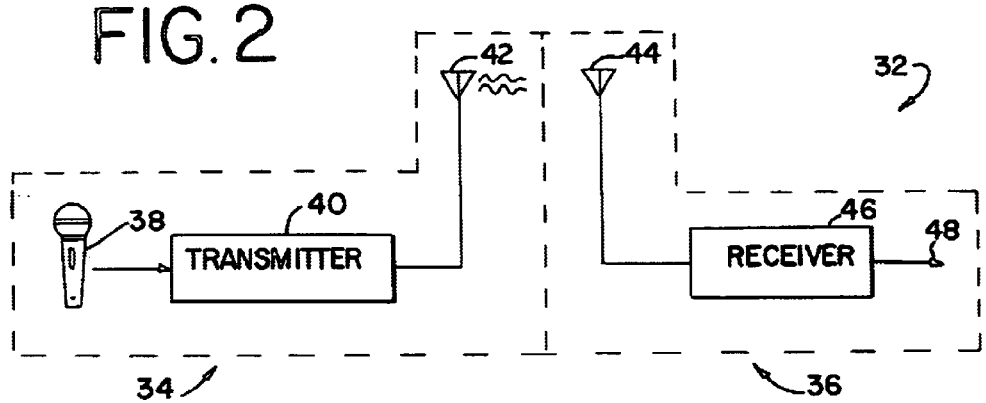
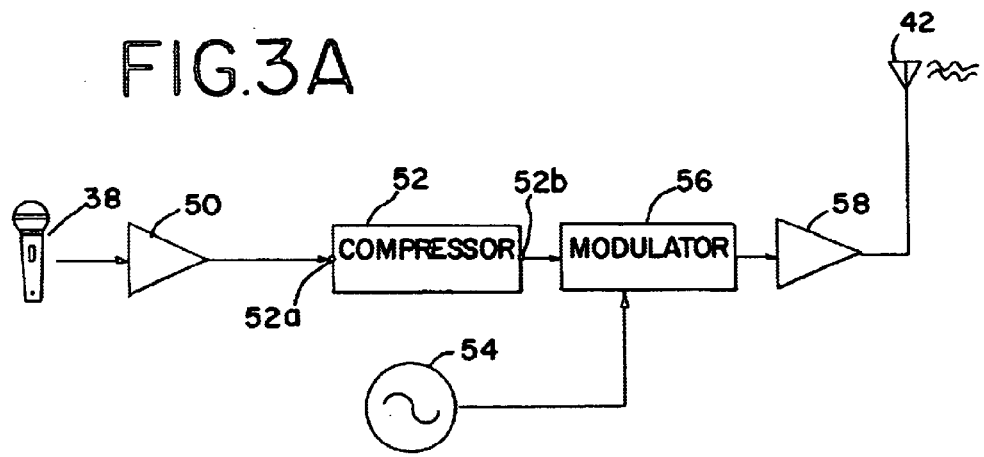
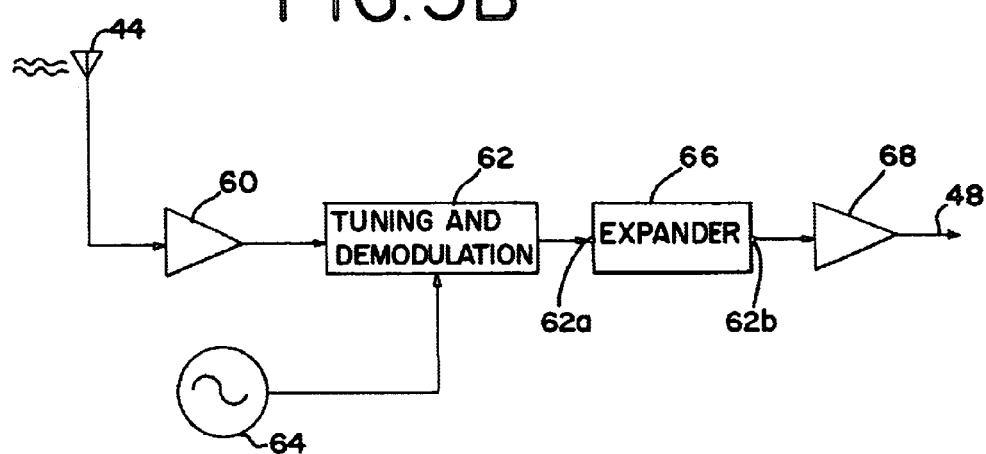

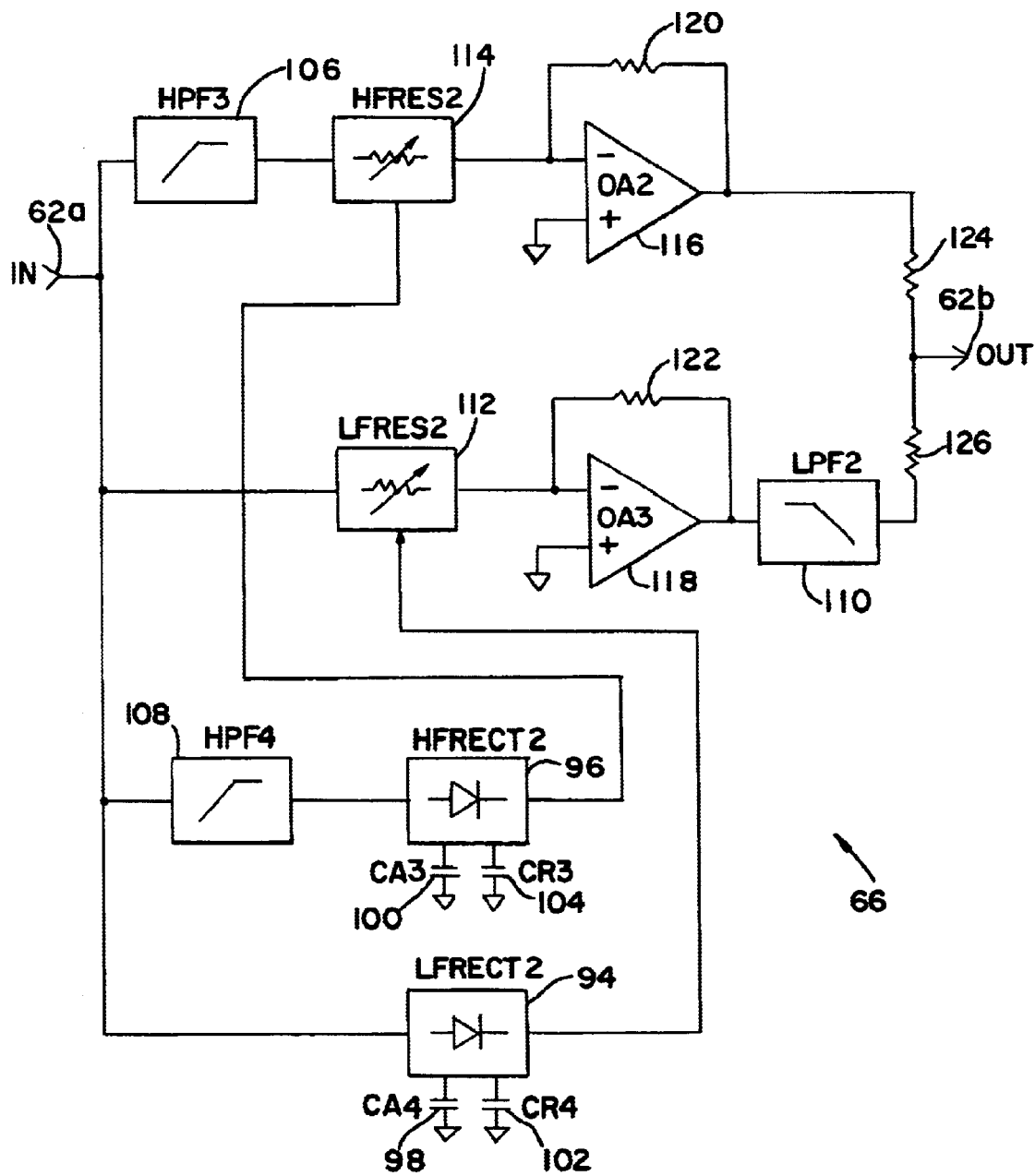

WIRELESS MICROPHONE HAVING A SPLIT-BAND AUDIO FREQUENCY COMPANDING SYSTEM THAT PROVIDES IMPROVED NOISE REDUCTION AND SOUND QUALITY

FIELD OF THE INVENTION

This invention generally relates to wireless microphone systems and, more particularly, to a wireless microphone system having a split-band audio frequency companding system that provides improved noise reduction and sound quality with reduced cost.

BACKGROUND OF THE INVENTION

Companding circuits that include a compressor circuit and an expander circuit may be used to increase the useable dynamic range of a signal that passes through a modulated space. In audio applications, this is done by first compressing the dynamic range of the information signal prior to modulation, and then expanding the dynamic range of the information signal after demodulation. Referring to FIGS. 1A and 1B, general, schematic representations of a typical compression circuit 10 and a typical expansion circuit 12, respectively, are shown.

In the circuit shown in FIG. 1A, a rectifier and filter element 14 is used to detect the amplitude of an input signal at terminal 16. The amplitude information is utilized to control the resistance of a variable resistance element 18 that is provided in the feedback loop of an operational amplifier 20. This circuitry is arranged so that relatively higher amplitude information generally reduces the resistance of the variable resistance element 18, while relatively lower amplitude information generally increases the resistance of the variable resistance element 20. This has the effect, for example, of reducing the gain of amplifier 20 for higher level signals at terminal 16, and of increasing the gain of amplifier 20 for lower level signals at terminal 16. Signal processing is continuously done across the frequency spectrum for signals of low amplitudes to signals of high amplitudes.

FIG. 1B is a general, schematic diagram of a typical expander circuit 12 that is used to expand the dynamic range of the signal at terminal 22. Circuit 12 includes generally the same circuit components that form the compression circuit shown in FIG. 1A, such components including a variable resistance element 24, a rectifier and filter element 26, an operational amplifier 28, and a feedback resistor 30. However, the circuit components shown in FIG. 1B are rearranged as shown so that the gain of the operational amplifier 28 increases as the amplitude of the signal at terminal 22 increases, and so that the gain of the operational amplifier 28 decreases as the amplitude of the signal at terminal 22 decreases.

The problems associated with such compandor circuitry are largely due to the time constant of the integrating filter of the rectifier that forms a portion of the rectifier and filter components 14 and 26 (FIGS. 1A and 1B). If the time constant is made relatively large, then amplitude modulation of the higher frequency components of the noise by lower frequency components of the signal can be heard by a user. This is commonly referred to as "breathing," which is undesirable, especially in high-end audio applications.

Signals with a quick rise time often are distorted by typical compandor circuits because, for example, the compressor circuit portion of the compandor circuit may not be able to react fast enough to keep the signal within the linear range of the modulated space. If the time constant is short, "breathing" goes away, but lower frequency signals become distorted due to rectifier ripple. Both of the above-referenced problems are particularly evident in wide band audio implementations such as, for example, wireless microphone applications.

Distortion problems can be reduced by establishing separate attack and release time constants for the rectifiers that are used in the compression and expansion circuits. However, there is still a serious compromise in performance that must be made for wide band signals present in high-end audio applications.

Various specific compander circuits are known. See, for example, U.S. Pat. No. 4,353,035 that discloses a circuit for compression or expansion of an electrical signal. This patent states that a two-band compander pre-emphasis is carried out during compression and de-emphasis during expansion in the lower frequency range. This patent states that noise suppression is improved by the pre-emphasis and de-emphasis operations. The content of U.S. Pat. No. 4,353,035 is incorporated by reference into this application as if fully set forth herein.

In another application, U.S. Pat. No. 4,449,106 discloses a noise reducing apparatus that includes a circuit that processes signals in a plurality of frequency bands. This patent states that the mid and high frequencies are intensified when the signal level is low. This patent also states that the signal level versus noise level ratio in the mid and high frequency ranges is increased with respect to the noise introduced in the transmission path. The content of U.S. Pat. No. 4,449,106 is incorporated by reference into this application as if fully set forth herein.

In yet another application, U.S. Pat. No. 5,832,097 discloses a multi-channel synchronous companding system for hearing aids. This patent states that an input signal is directed through a 2:1 compressor, and then is directed through a band splitting filter to divide the signal into a desired number of frequency bands. This patent further states that the divided signals are then passed through expander/compressors to provide selected expansion/compression of each frequency band as a function of the user's hearing impairment. The content of U.S. Pat. No. 5,832,097 is incorporated by reference into this application as if fully set forth herein.

The above-described circuits are suitable for their intended purposes. However, such circuits may not be suitable for a number of applications such as, for example, high end wireless microphone applications. In such applications, a premium is placed on the quality of the audio reproduction. Also, a premium is placed on the ability to manufacture such microphones with reduced cost that allows the manufacturer's profit margin to be maximized. Furthermore, battery life is a concern in the transmitter portion of typical wireless microphones because the presence of a greater number of active elements increases current drain and correspondingly decreases battery life.

SUMMARY OF THE INVENTION

It is desirable to provide a wireless microphone having a multi-band audio companding system. One aspect of the present invention is that the companding system includes a compression circuit in which one amplification element is utilized in connection with a number of frequency bands, each frequency band having a rectifier and filter element associated therewith. A further aspect of the present invention is that high-pass filter elements are utilized in the higher frequency bands of the compression and expander circuits to reduce the transfer of low-frequency signals to the rectifier elements that process the high-frequency signals, thereby reducing undesirable modulations of a variable resistance element associated therewith.

Providing a wireless microphone with such a companding system has a number of distinct advantages. First, the time constants of the integrating filter of the rectifier utilized in the compression and expansion circuits are individually set with respect to each frequency band that is processed, thereby allowing improved audio reproduction. Second, breathing problems are reduced. Third, problems associated with rectifier ripple are minimized. Fourth, the material costs associated with manufacturing such a wireless microphone are significantly reduced because a smaller number of circuit components are utilized.

Other features and advantages of the invention will become apparent from the description that follows.

DESCRIPTION OF THE DRAWINGS

FIG. 1A is a general, schematic representation of a prior art compression circuit;

FIG. 1B is a general, schematic representation of a prior art expansion circuit;

FIG. 2 is a general, schematic representation of a wireless microphone system that incorporates a split-band audio frequency companding system that provides improved noise reduction and sound quality;

FIG. 3A is a general, schematic representation of the transmitter portion 34 of the wireless microphone system 32 shown in FIG. 2;

FIG. 3B is a general, schematic representation of the receiver portion 36 of the wireless microphone system 32 shown in FIG. 2;

FIG. 4B is a general, schematic representation of the expander circuit 66 shown in FIG. 3B;

DETAILED DESCRIPTION OF THE INVENTION

Figure 4A:
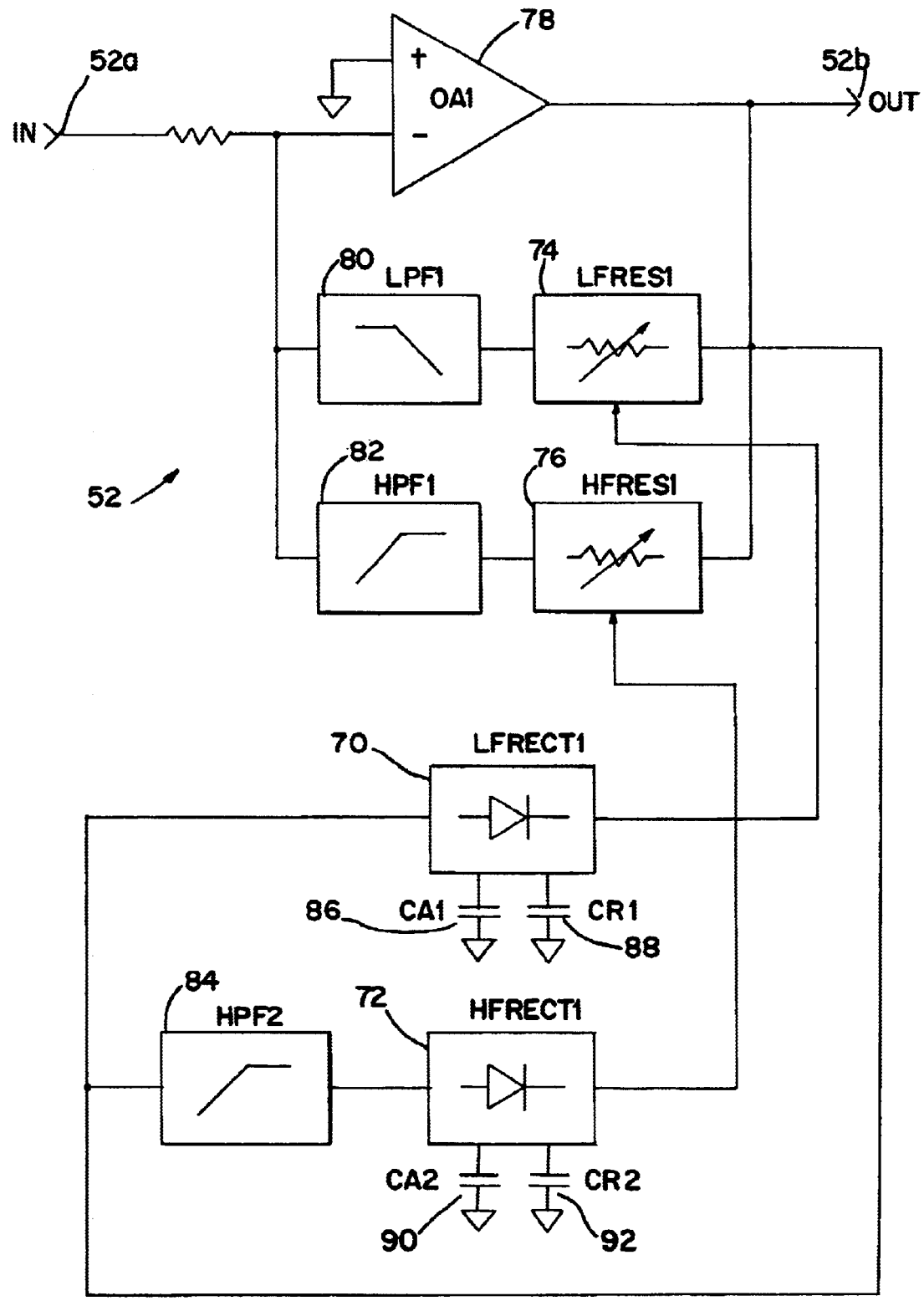
FIG. 4A is a general, schematic representation of the compressor circuit 52 shown in FIG. 3A.

While the present invention is susceptible of embodiment in various forms, there is shown in the drawings a number of presently preferred embodiments that are discussed in greater detail hereafter. It should be understood that the present disclosure is to be considered as an exemplification of the present invention, and is not intended to limit the invention to the specific embodiments illustrated.

FIG. 2 is a general, schematic diagram of a wireless microphone system 32 that incorporates a split-band audio frequency companding system that provides improved noise reduction and sound quality. System 32 includes a transmitter portion 34 and a receiver portion 36. Transmitter portion 34, includes a microphone 38, a transmitter circuit 40, and an antenna 42 that may be located at a first location when the system 32 is in use. In an exemplary application of the present invention, microphone 36 may be a directional microphone such as, for example, the digital and analog microphone disclosed in U.S. Pat. No. 6,084,973. The content of U.S. Pat. No. 6,084,973 is incorporated by reference into this application as if fully set forth herein.

The receiver portion 36 of the wireless microphone system 32 includes an antenna 44 and a receiver circuit 46. The receiver portion 36 produces an audio level output signal at terminal 48.

FIG. 3A is a general, schematic representation of the transmitter portion 34 of the wireless microphone system 32 shown in FIG. 2. Transmitter portion 34 includes an audio frequency amplifier 50 that amplifies the signal provided to it from microphone 38. A unique compressor circuit 52 compresses the signal provided to it at terminal 52a from amplifier 50, and provides a compressed signal at terminal 52b as discussed in greater detail hereafter. Radio frequency oscillator 54, modulator 56, and radio frequency amplifier 58 are utilized to provide a modulated and amplified signal to antenna 42 that is broadcast therefrom. It should be understood that any suitable means of modulation such as, for example, amplitude or frequency modulation techniques may be utilized in connection with the present invention.

FIG. 3B is a general, schematic representation of the receiver portion 36 of the wireless microphone system 32 shown in FIG. 2. Receiver portion 36 includes a radio frequency amplifier 60 that provides an amplified signal to the tuning and amplification circuit 62 that is operatively coupled to a local oscillator 64. An expander 66 is electrically coupled to the tuning and demodulation circuit 62 via terminal 62a to allow an audio output signal to be provided at terminal 48 via terminal 62b and audio frequency amplifier 68 as discussed in greater detail hereafter.

FIG. 4A is a general, schematic representation of the compressor circuit 52 shown in FIG. 2A, while FIG. 4B is a general, schematic representation of the expander circuit 66 shown in FIG. 2B. In the embodiment of the present invention illustrated in FIGS. 4A and 4B, two frequency bands are utilized to allow low and high frequency signals to be companded separately in two distinct frequency bands. However, it should be understood that any number of frequency bands can be utilized in accordance with the principles of the present invention disclosed in this application.

Referring to FIG. 4A, a low-frequency rectifier 70 and a high-frequency rectifier 72 are utilized for compression purposes. Each rectifier 70 and 72 is provided with separate attack and release time constants as discussed in greater detail hereafter. Two variable resistance elements 74 and 76 are provided in the feedback loop of operational amplifier 78. A low-pass filter 80 and a high-pass filter 82 are electrically coupled to the inputs of the variable resistance elements 74 and 76, respectively. A high-pass filter 84 is electrically coupled to the high-frequency rectifier 72 as shown in FIG. 4A.

Compression circuit 52 includes an attack capacitor 86 and a release capacitor 88 that are operatively electrically coupled to the low-frequency rectifier 70. Capacitors 86 and 88 are optimized for frequencies below the crossover point. An attack capacitor 90 and a release capacitor 92 are operatively electrically coupled to the high frequency rectifier 72 as shown in FIG. 4A. Capacitors 90 and 92 are optimized for frequencies above the cross-over point.

In operation, the low-pass filter 80 causes the low-frequency adjustable resistance element 74 to control the gain of operational amplifier 78 at frequencies below the crossover point. Similarly, the high-pass filter 82 causes the high-frequency adjustable resistance element 76 to control the gain of the operational amplifier 78 at frequencies above the crossover point. High-pass filter 84 reduces the transfer of low-frequency components into the high-frequency rectifier 72 that would create harmonics that would modulate the high frequency adjustable resistance element 76. Modulation of component 76 in this manner is especially undesirable in high-end audio applications.

Referring to FIG. 4B, the expander circuit 66 includes a low-frequency rectifier 94 and a high-frequency rectifier 96. Rectifiers 94 and 96 include attack capacitors 98 and 100, as well as release capacitors 102 and 104, respectively, that provide separate attack and release time constants for each rectifier. The attack and release capacitors 98 and 102 on low-frequency rectifier 94 are optimized for frequencies below the crossover point, and are equal to the timing capacitors on low-frequency rectifier 70 (FIG. 4A). Likewise, the attack and release times for high-frequency rectifier 96 are optimized for frequencies above the crossover point, and are equal to the timing capacitors on high-frequency rectifier 72.

Expander circuit 66 also includes two high-pass filters 106 and 108, a low-pass filter 110, a low-frequency variable resistance element 112, a high-frequency variable resistance element 114, and two operational amplifiers 116 and 118. Appropriate resistors 120 and 122 are provided in a feedback loop of the operational amplifiers 116 and 118 as shown.

In operation, high-pass filter 106 causes the high-frequency variable resistance element 114 to control the gain of operational amplifier 116 above the crossover point. Similarly, the gain of operational amplifier 116 is controlled for low frequencies by the low-frequency variable resistance element 112. However, the output of operational amplifier 118 is filtered by low-pass filter 110. Placing low-pass filter 110 after the operational amplifier 118 is advantageous because, for example, a reduction in noise and distortion over placing it before the operational amplifier 118 is obtained.

High-pass filter 108 reduces the transfer of low frequency signal components from entering high-frequency rectifier 96. This provides a number of distinct advantages such as, for example, a reduction in the production of harmonics that would modulate the high-frequency variable resistance element 114 in an undesirable manner. The high and low expanded components are summed via resistors 124 and 126 to create a single output signal at terminal 62*b*.

The crossover frequency between the two frequency bands utilized in the compressor circuit 52 and the expander circuit 66 is determined by the time constants of the following circuit components: high-pass filter 82, high-pass filter 84, high-pass filter 106, high-pass filter 108, low-pass filter 80, and low-pass filter 110. In the illustrated embodiment of the invention, the time constants of these filter elements are all generally equal to each other.

Figure 5:
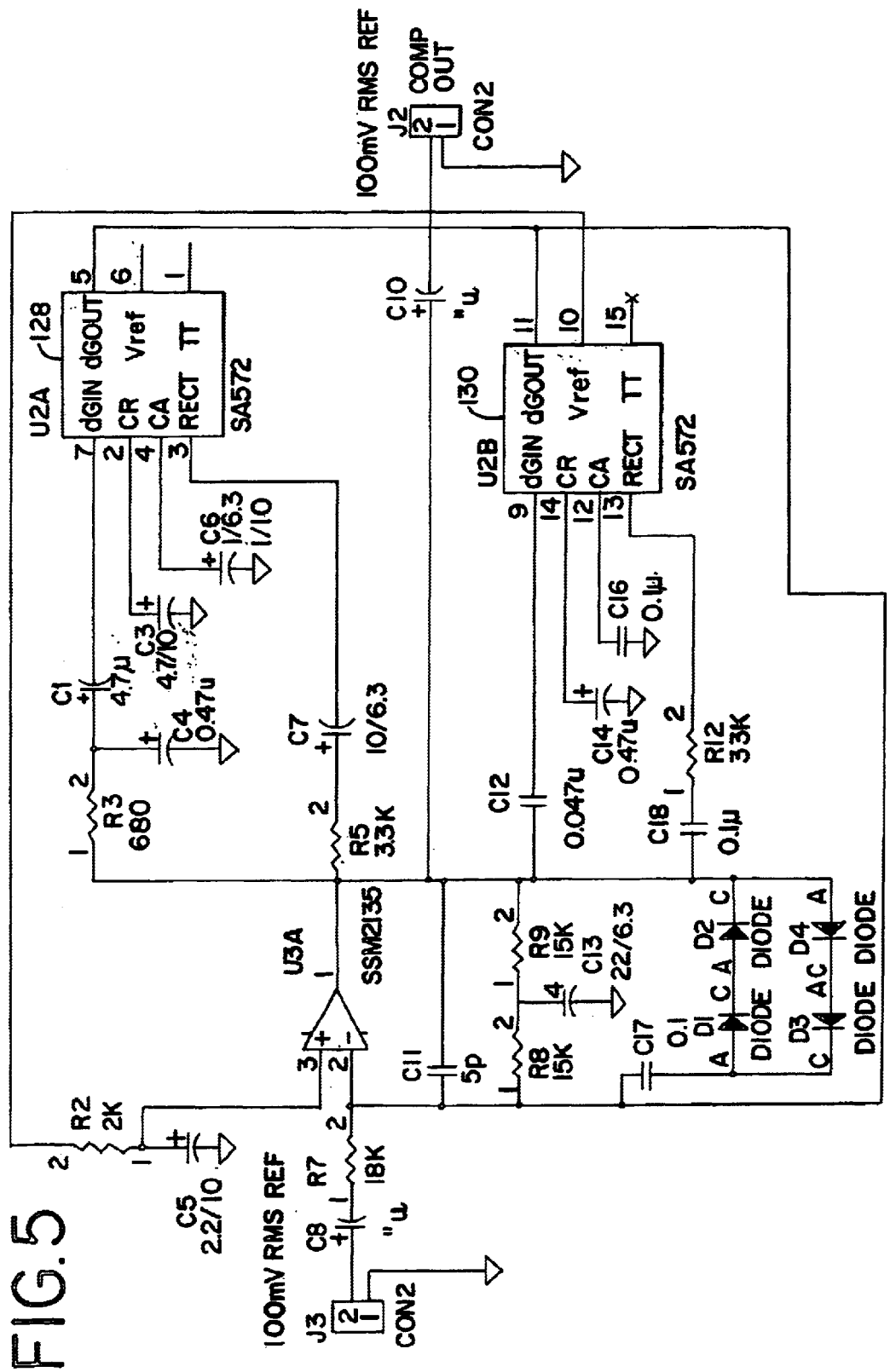
FIG. 5 is a detailed schematic diagram of a specific application of the compressor circuit 66 shown in FIG. 4A.
Figure 6:
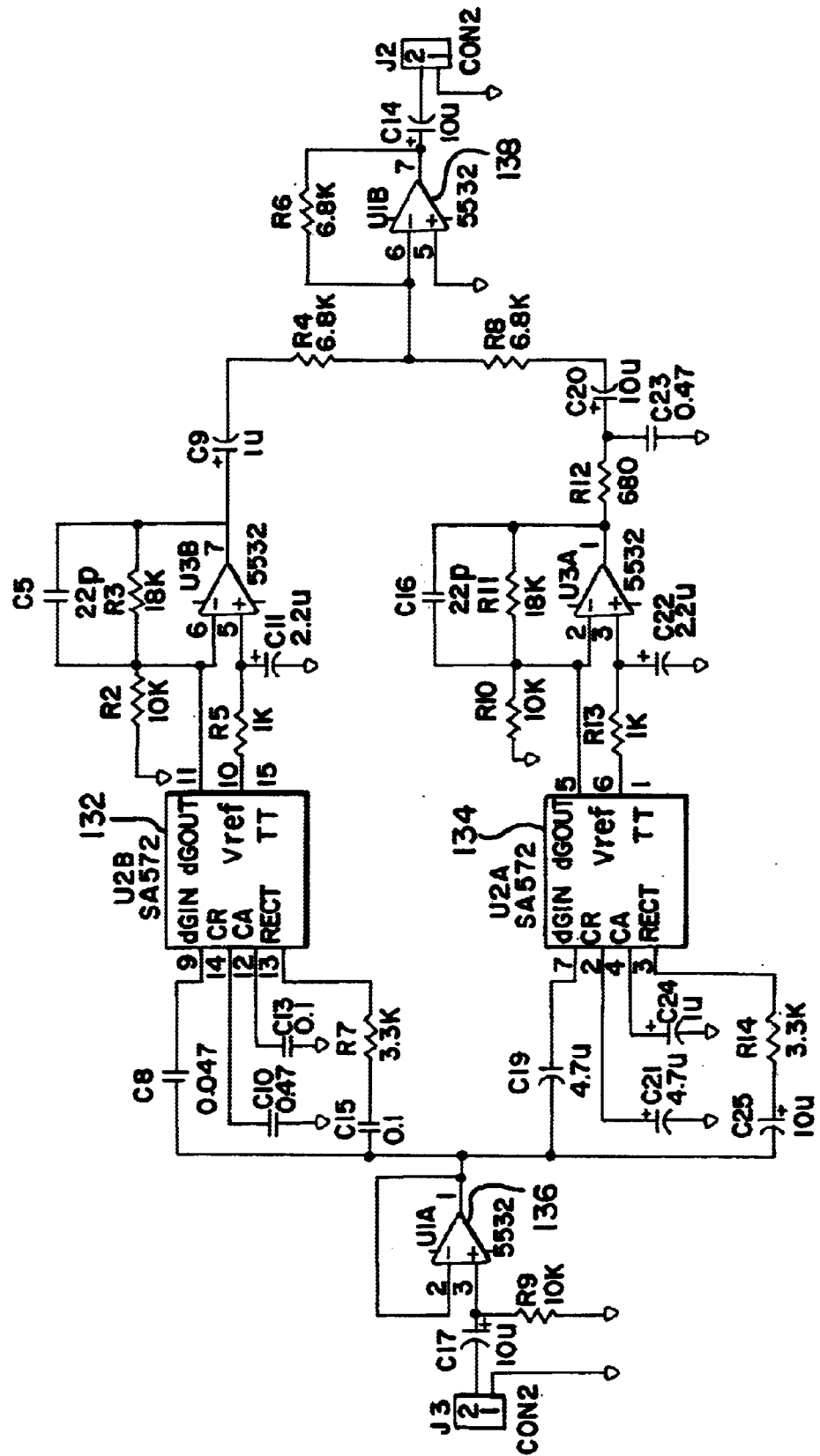
FIG. 6 is a detailed schematic diagram of a specific application of the expander circuit shown in FIG. 4B.

FIGS. 5 and 6 are detailed schematic diagrams of a specific implementation of the compression circuit 52 and the expander circuit 66 shown in FIG. 2. In the embodiment of the invention illustrated in FIGS. 5 and 6, four commercially available programmable analog compander circuits 128, 130, 132, and 134 are utilized. A circuit that is preferred for this application is available from Phillips Semiconductors as programmable analog compander circuit model no. SA572. Use of such circuit components provides a number of distinct advantages such as, for example, allowing for separate attack and release timing capacitors.

Referring to FIG. 5, R3 and C4 correspond to the low-pass filter 80 shown in FIG. 4A. C12 and a 6.8K resistor that is internal to the circuit 130 form the high-pass filter element 82 shown in FIG. 4*a*. The high pass-filter element 84 (FIG. 4A) is formed from C18 and R12. C6 and C3 correspond to the attack and release capacitors 86 and 88 (FIG. 4A), while C14 and C16 correspond to attack and release capacitors 90 and 92 (FIG. 4A). The low-frequency rectifier 70 and the low-frequency variable resistance element 74 (FIG. 4A) are internal to compandor circuit 128, while high-frequency rectifier 72 and the high-frequency variable resistance element 76 (FIG. 4A) are internal to the compander circuit 130.

Referring to FIG. 6, R12 and C23 form the low-pass filter 110 (FIG. 4B). C8 and a 6.8K resistor that is internal to the compandor circuit 132 form the high-pass filter 106 (FIG. 4B). The high pass filter 108 shown in FIG. 4B is formed from C15 and R7 shown in FIG. 5. C13 and C10 correspond to attack capacitor 100 and release capacitor 104 (FIG. 4B), while C24 and C21 correspond to attack capacitor 98 and release capacitor 102. Low-frequency rectifier 94 and low-frequency variable resistance element 112 are internal to compander circuit 134. High-frequency rectifier 96 and high-frequency variable resistance element 114 are internal to compander circuit 132. Amplifier 136 is a buffer amplifier that is used to drive the expander circuit, while amplifier 138 a summing amplifier.

Figure 7:
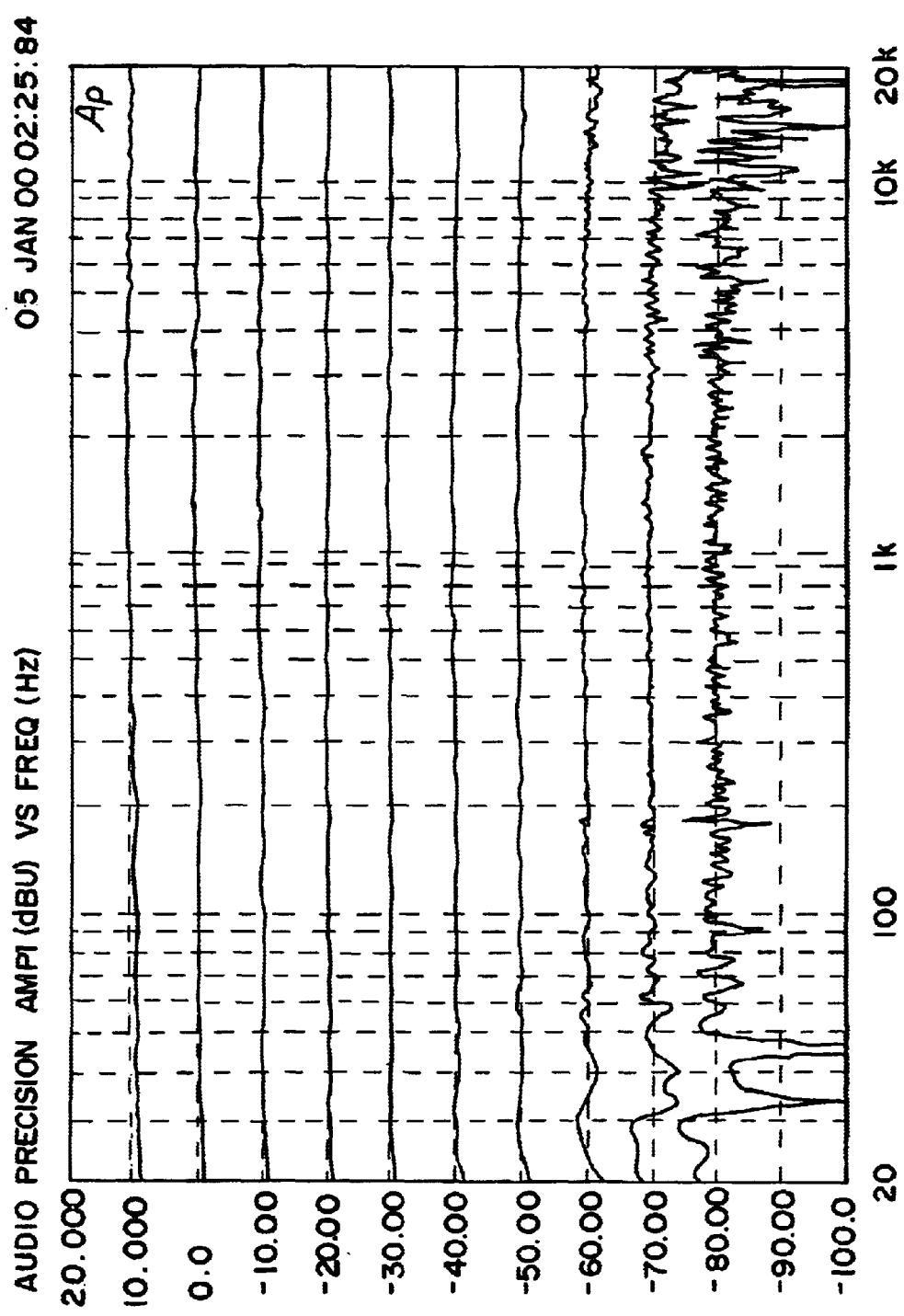
FIG. 7 is a graph that illustrates the audio performance of the companding circuitry illustrated in FIGS. 5 and 6 that is utilized in the wireless microphone system shown in FIG. 2.

FIG. 7 shows the excellent frequency and amplitude linearity of the companding circuitry shown in FIGS. 4A and 4B across the full audio band. Linearity in this manner is quite desirable for high-end audio applications such as wireless microphone applications.

The illustrated embodiments of the present invention concern wireless microphone applications. However, it should be understood that the unique split-band companding circuitry disclosed herein may be utilized in other applications such as, for example, wireless musical instruments such as electric guitars, electric bases and the like.

From the foregoing it will be observed that numerous modifications and variations can be effectuated without departing from the true spirit and scope of the novel concepts of the present invention. It is to be understood that no limitation with respect to the specific embodiments illustrated is intended or should be inferred. The disclosure is intended to cover by the appended claims all such modifications as fall within the scope of the claims when the claims are properly interpreted.

What is claimed is:

1. A wireless microphone system, comprising in combination:
   a transmitter disposed at a first location, said transmitter having a transducer that generates a first signal that is generally representative of an audio signal that is present at the first location, said transmitter broadcasting said first signal in a modulated space;
   a receiver disposed at a second location that is different from said first location, said receiver receiving said broadcast first signal from said modulated space and producing a second signal that is generally representative of said audio signal;
   said transmitter including a compressor circuit that decreases the dynamic range of said first signal, said compression circuit including an operational amplifier that has a feedback loop from an output terminal thereof to an input terminal thereof that is divided into at least two frequency bands,
   a first one of said frequency bands of said feedback loop including a low pass filter that is electrically connected to the input terminal of said operational amplifier, said low pass filter also being electrically connected to the output terminal of said operational amplifier via a first variable resistance element, said compressor circuit further comprising a first rectifier element that controls the resistance of said second variable resistance element in accordance with signals received from the output terminal of said operational amplifier, said first rectifier element being optimized for frequencies below a cross-over frequency, a second one of said frequency bands of said feedback loop including a high pass filter that is electrically connected to the input terminal of said operational amplifier, said high pass filter also being electrically connected to the output terminal of said operational amplifier via a second variable resistance element, said compressor circuit further including a second rectifier element that controls the resistance of said second variable resistance element in accordance with signals received from the output terminal of said operational amplifier that generally are at or above said cross-over frequency, said second rectifier element being optimized for frequencies above said cross-over frequency; and said receiver including an expander circuit that increases the dynamic range of received broadcast first signal, said receiver producing an output signal at said second location that is generally representative of the audio signal at said first location.

2. The wireless microphone system of claim 1 wherein said modulated space comprises a frequency modulated space.

3. The wireless microphone system of claim 2 wherein the feedback loop of said amplifier includes two frequency bands.

\* \* \* \* \*